United States Patent
Ghis et al.

(10) Patent No.: US 6,376,825 B1
(45) Date of Patent: Apr. 23, 2002

(54) SINGLE SHORT RADIATION PULSE ANALYZER HAVING SIGNAL SAMPLING DELAY TIME

(75) Inventors: Anne Ghis, Saint-Martin d'Heres; Marie-Claude Gentet, Crolles, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/497,442

(22) Filed: Feb. 8, 2000

(30) Foreign Application Priority Data

Feb. 17, 1999 (FR) .............................. 99 01922

(51) Int. Cl.⁷ ............................................. H01J 40/14
(52) U.S. Cl. ............................ 250/214 R; 250/227.12; 250/208.1
(58) Field of Search ................... 250/214 R, 208.1, 250/225, 227.12, 214 LS; 356/222, 219, 226; 327/514, 515; 348/294, 295

(56) References Cited

U.S. PATENT DOCUMENTS 5,144,141 A * 9/1992 Rougeot et al. ............ 250/369
5,471,162 A   11/1995 McEwan ..................... 327/92

FOREIGN PATENT DOCUMENTS

| EP | 0893705 | 1/1999 |
| FR | 2766576 | 1/1999 |
| WO | WO93/13427 | 7/1993 |

* cited by examiner

Primary Examiner—Que L. Le
(74) Attorney, Agent, or Firm—Burns Doane Swecker & Mathis LLP

(57) ABSTRACT

The invention relates to a single short radiation pulse analyzer comprising radiation detectors that convert this radiation into an electrical signal, and means of measuring this signal by sampling at different times.

5 Claims, 2 Drawing Sheets

SINGLE SHORT RADIATION PULSE ANALYZER HAVING SIGNAL SAMPLING DELAY TIME

DESCRIPTION

1. Field of the Invention

The invention relates to a single short radiation pulse analyzer capable of measuring this radiation pulse. This pulse measurement may be applied to different types of radiation including X-ray or infrared radiation, visible radiation and electromagnetic energy.

The invention is applicable in all domains necessary for the measurement of a non-repetitive and very short radiation pulse, and particularly for the measurement of events generated by phenomena with a duration measured in picoseconds.

2. State of the Art

In general, pulse metrology is used to describe the variation with time of an electrical signal, and particularly its voltage or its energy when this signal is single (in other words not repetitive) and very short (in other words its duration is of the order of a few nanoseconds).

This type of signal to be measured is usually derived from very fast radiation detectors that convert energy from a radiation pulse that they received, into electrical signals. This type of radiation may be emitted by ultra-fast radiation sources such as lasers or synchrotronic radiation sources, or it may be the result of a radiation-material interaction, for example caused by an ultra-fast laser (in other words in which the pulse duration is of the order of a few picoseconds up to a few nanoseconds).

At the present time, instruments are available on the market for analyzing this type of single pulse signals (or electrical pulse) for which the spectrum range is up to 2 GHz. In particular, this type of instrument is marketed by INTERTECHNIQUE, TEKTRONIX®, HP®, LECROY®, etc.

There are sampling oscilloscopes for measuring repetitive electrical pulses with a wider band, capable of measuring signals for which the spectrum range is up to 50 to 70 GHz.

The energies necessary to supply the radiation pulses are very high on some cases, and particularly during radiation-material type experiments. These experiments cannot be repeated; they are non-repetitive experiments.

At the present time, instruments are available for measuring single pulses, as described in U.S. Pat. No. 5,471,162. However, this electrical pulse measurement instrument must be associated with radiation detectors, before it can measure radiation pulses. This association is made using miscellaneous cables and connectors.

However, these detectors, cables, connectors and measuring instruments each have their own characteristics and pass bands, and their own impedances more or less well adapted to the assembly and their own rise time. Therefore the electrical signal is distorted by these successive transitions.

Furthermore, if the measurement instrument is based on the principle of spatial sampling, the electrical signal is distorted differently inside the instrument depending on the measurement point.

DESCRIPTION OF THE INVENTION

The purpose of the invention is to correct the disadvantages mentioned above.

Consequently, it proposes a single radiation pulse analyzer comprising radiation detectors that convert this radiation into an electrical signal, and means of measuring this signal by sampling at different times, without any spatial spreading of the signal.

More precisely, the invention relates to a single radiation pulse analyzer comprising:

- a number of radiation detectors capable of receiving the radiation pulse and transforming it into a number of electrical signals;
- a number of sampling means, each connected to one of the radiation detectors and capable of sampling the electrical signal output from the detectors at different times;
- delay means, each connected to sampling means to delay the sampling time between two sampling means by a time interval (dt);
- storage means, each associated with a sampling means to store information output from the said sampling means; and
- means of reading and processing this information.

The electrical signals may be sampled at as many different times as there are sampling means.

Advantageously, the detectors are associated in the form of a network with two faces, polarized by a common electrode on one face and an individual central electrode on the other face.

According to one embodiment of the invention, the detectors form a square network addressed sequentially in rows and columns.

According to another embodiment of the invention, the detectors form a spiral network addressed starting from the center of the network.

DETAILED DESCRIPTION OF EMBODIMENTS OF THE INVENTION

The invention relates to an analyzer capable of measuring a single very short radiation pulse in a single operation.

This analyzer comprises firstly a number of detectors combined to receive radiation pulses and to transform these radiation pulses into electrical pulses. It comprises secondly an electronic circuit controlling sampling, and processing of these electrical pulses. This circuit contains a number of samplers designed to measure and process the electronic pulses output by the detectors. More precisely, the electronic circuit comprises one sampler for each detector, each sampler being directly connected to a detector.

In other words, the single radiation pulse analyzer according to the invention integrates the conversion of radiation energy into electrical energy, and also samples the electrical pulse at different times. This is an advantage of the invention.

Figure 1:
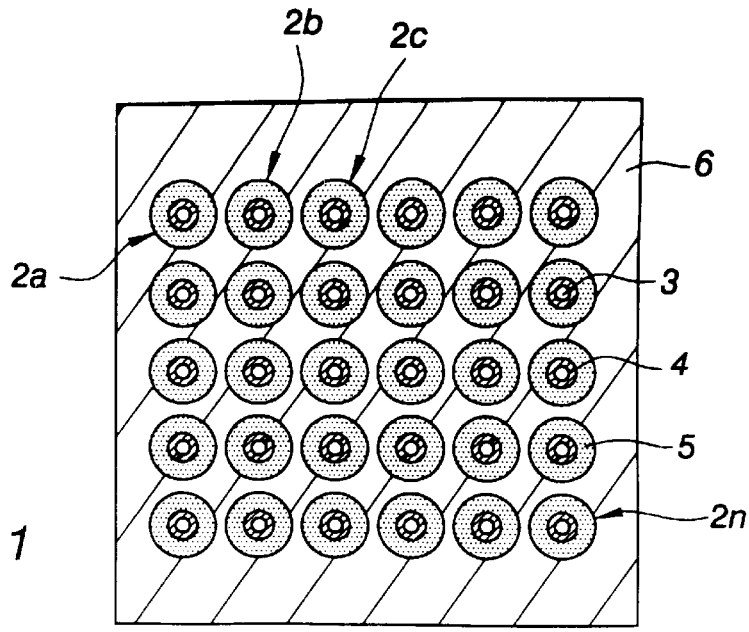
FIG. 1 diagrammatically shows a top view of the device according to the invention.

FIG. 1 shows a top view of the analyzer according to the invention. In other words, this figure shows an example of a detectors network used in the single radiation pulse analyzer according to the invention. This detectors network mark 1 is composed of a number of detectors marks 2a, 2b, 2c, etc., 2n.

More precisely, this network comprises a substrate, for example made of sapphire, perforated with holes mark 3, in which the sides, edge and bottom are covered with a conducting material 4. The substrate is covered with a layer of photoconducting material 5, such as CdTe or GaAs, and then a deposit of a conducting material 6 such as gold. This conducting material is deposited so as to leave a ring of photoconducting material 5 uncovered around each hole, shown as "speckles" in FIG. 1. Advantageously, the conducting materials 4 and 6 are identical. They are shown cross hatched in FIG. 1.

The result is a network of detector rings that are concentrically polarized by a collective electrode made by the layer of conducting material 6, and by an individual central electrode placed on the other side of the substrate.

The detectors network shown in FIG. 1 is an example of a network in which the detectors are placed in rows and columns and are collectively polarized on the upper face by the conducting material 6, and individually polarized on the other face of the network by the conducting material 4.

The detectors that have just been described are fast, in other words they have a short response time. These detectors operate in photoconduction and their geometry is adapted to the polarization voltage. This polarization voltage is determined as a function of the characteristics of samplers and the radiation energy to be measured. Therefore, $I_s(t)=V_{po1}/R$ where $I_s(t)$ is the intensity of the signal at time t, $V_{po1}$ is the polarization voltage and R is the resistance under illumination for the incident pulse energy.

Figure 2:
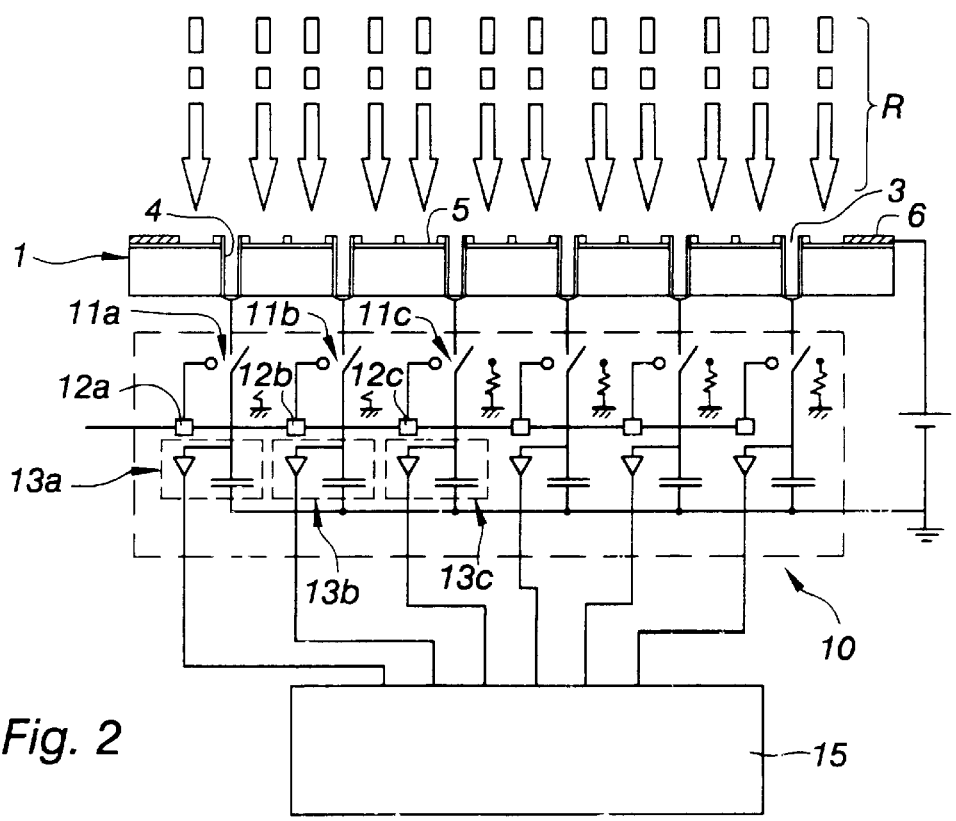
FIG. 2 diagrammatically shows a sectional view of the device according to the invention, with the detectors network and the processing means for each electronic pulse.

FIG. 2 shows a sectional side view of the radiation pulse analyzer according to the invention. This FIG. 2 shows the detectors network in FIG. 1 associated with the electronic circuit for sampling and measurement of electrical signals output by the detectors network.

More precisely, FIG. 2 diagrammatically shows incident radiation R input to the surface of the detectors network 1.

The detectors network 1 transforms this radiation into electrical pulses and transmits them to the sampling and measurement circuit 10 which may be an integrated circuit. This circuit 10 comprises a matrix of samplers 11a, 11b, etc., each sampler being directly connected to one of the detectors in network 1. Each sampler is also associated with a resistance connected to the ground. This resistance is a drain resistance, the function of which is to prevent the detector from becoming charged during the time interval in which the signal is not being sampled. Therefore, the electrical signal output by each detector is input directly into a sampler.

In other words, the entire radiation pulse is received by each detector that transforms the radiation pulse into electrical pulses. Each of these electrical pulses is sampled by a sampler, the set of samplers being activated one after the other at a predetermined time step dt. In other words, each sampler samples a part of the electrical signal corresponding to the radiation pulse received simultaneously by all detectors, at a different time. This time delay in the propagation of the sampling signal between the different samplers 11a, 11b, etc., is achieved by a means of delay circuits 12a, 12b, etc. These delay circuits 12a, 12b, etc., also called "controlled sampling order distribution circuits" control the distribution of the sampling order by delaying the signal between two samplers by a time dt.

Storage means 13a, 13b, etc., are associated with each sampler 11a, 11b, etc., so as to memorize information output from the detectors and amplify it and then send it to an information reading and processing system 15.

Thus, the sampling and measurement circuit 10 comprises a sampler 11 associated with a controlled distribution circuit 12 and storage means 13, for each detector in network 1. Therefore each sampler has its own control and synchronization means.

The geometric layout of these elements 11, 12, 13 on the sampling and measurement circuit 10 is in accordance with the geographic layout of the detectors network 1.

The detectors network 1 and the circuit 10 are connected through the back of the detectors network and the front of the samplers matrix, through a microconnection network.

For example, the time measurement of a single radiation pulse can be made at a hundred points by making a network of a hundred detectors, as compact as possible. A compact detectors network enables maximum use of the area of the radiation beam, in order to obtain the best possible measurement sensitivity. These 100 detectors then have to be connected as closely as possible with 100 samplers, each detector being connected to a sampler through a controlled sampling order distribution circuit shown as mark 12 in FIG. 2.

Note that the device according to the invention may comprise a variable number of points depending on needs. In the example shown in FIGS. 1 and 2, the analyzer enables a measurement at 30 points.

The advantage of the single radiation pulse analyzer according to the invention is that it enables sampling of the electrical pulse at different times, without spatial spreading of the electrical pulse and therefore without propagation. The lack of spatial spreading of the pulse implies that the transfer function is uniform for the various sampling points.

Furthermore, this analyzer is made without any intermediate connection, thus minimizing distortion of the electrical signal.

According to this device, the energy of the signal to be measured is distributed over all detectors; therefore, this energy must be sufficient to significantly irradiate all detectors in the detectors network 1.

Figure 3:
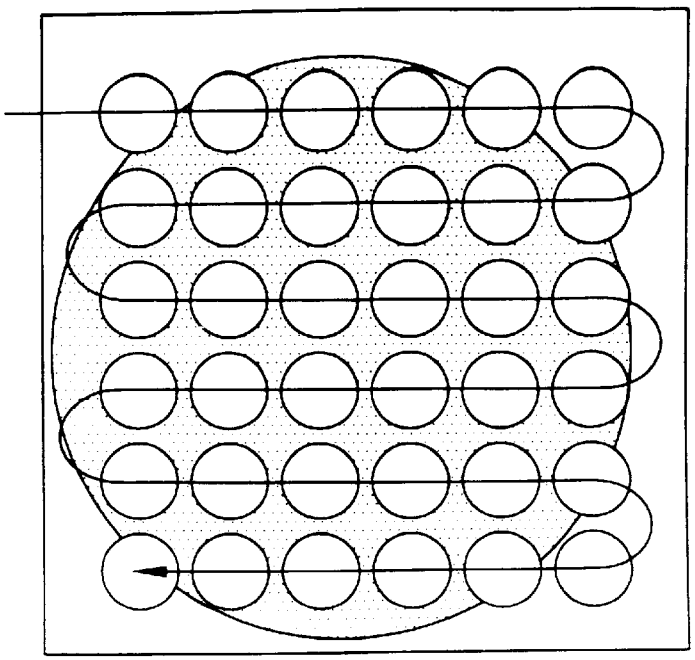
FIGS. 3 and 4 each show an embodiment of the detectors network.
Figure 4:
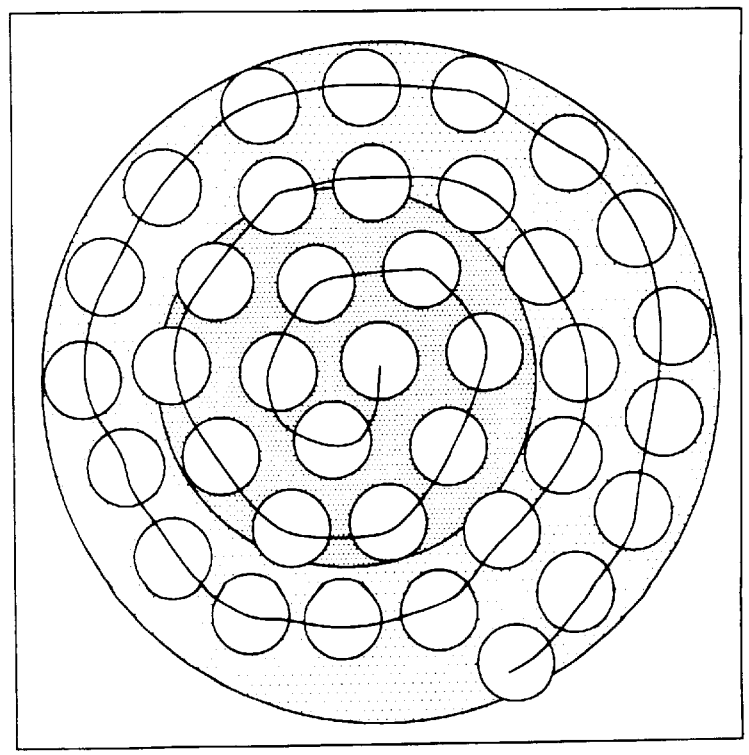

The radiation distribution may be optimized by arranging the detectors in several variants, such as those shown in FIGS. 3 and 4.

FIG. 3 shows an example of a conventional layout of detectors. According to this embodiment, the detectors form a square network, addressed sequentially in rows and columns. In this figure the radiation is shown by a speckled circle and each white circle diagrammatically represents a detector; addressing is shown diagrammatically by the arrow.

For row and column sequencing, if the focal spot is reduced, the detectors located at the ends of the detectors network are not irradiated; therefore there is no information on these measurement points, which results in a "hole" in the reproduction of the signal with time. This problem can be solved by deciding to address the detectors in a different form, as shown in FIG. 4.

In FIG. 4, the detectors are shown in sequence in a spiral layout starting from the center of the network. With this layout, the irradiated area (diagrammatically shown by "speckles") and the number of measurement points can be adjusted to optimize the detection sensitivity. The size of the focusing spot can be reduced to increase the energy density on the detectors, and the number of irradiated detectors, and therefore the number of measurement points, is reduced. Thus, the time interval between two successive sampling-scan be configured, so that the same analysis time window can be kept.

What is claimed is:

1. Single radiation pulse analyzer, characterized in that it comprises:

a number of radiation detectors (2a, ..., 2n) suitable for receiving radiation pulse and transforming it into a number of electrical signals;

a number of sampling means (11a, ..., 11n), each connected to one of the radiation detectors and capable of sampling the electrical signal output from the detectors at different times;

delay means (12a, ..., 12n), each connected to sampling means to delay the sampling time between two sampling means by a time interval (dt);

storage means (13a, ..., 13n), each associated with a sampling means to store information output from the said sampling means; and means (15) of reading and processing this information.

2. Analyzer according to claim 1, characterized in that the electrical signals being sampled at as many different times as there are sampling means.

3. Analyzer according to claim 1, characterized in that the detectors are associated in the form of a network with two faces, polarized by a collective electrode on one face and an individual central electrode on the other face.

4. Analyzer according to claim 1, characterized in that the detectors form a square network addressed sequentially in rows and columns.

5. Analyser according to claim 1, characterized in that the detectors form a spiral network addressed starting from the center of the network.

* * * * *